(12) United States Patent
Lu

(10) Patent No.: US 6,239,010 B1
(45) Date of Patent: May 29, 2001

(54) METHOD FOR MANUALLY MANUFACTURING CAPACITOR

(75) Inventor: Jau-Hone Lu, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/347,612

(22) Filed: Jul. 2, 1999

(51) Int. Cl.⁷ .................. H01L 21/4763; H01L 21/8242; H01L 21/336

(52) U.S. Cl. .................. 438/592; 438/239; 438/241; 438/253; 438/258; 438/287

(58) Field of Search ................. 438/592, 253, 438/239, 241, 287, 258

(56) References Cited

U.S. PATENT DOCUMENTS 5,079,670 * 1/1992 Tigelaar et al. .................. 361/313
6,066,528 * 5/2000 Fazan et al. ..................... 438/253
6,096,619 * 8/2000 Yamamoto et al. ............... 438/393

* cited by examiner

*Primary Examiner*—Jey Tsai
*Assistant Examiner*—Jennifer M. Kennedy

(57) ABSTRACT

A method for manufacturing a capacitor of a mixed-mode circuit. A substrate is provided. An isolation region is formed on the substrate to define an active region in the substrate. An oxide layer, a first polysilicon layer and a first silicide layer are formed over the substrate. The oxide layer, the first polysilicon layer and the first silicon layer are patterned to form a gate structure on the active region and to form a first polysilicon electrode and a first silicide electrode on the isolation region. A dielectric layer is formed over the substrate. An opening is formed to expose a portion of the first silicide electrode. A second silicide layer is formed on a sidewall and a bottom of the opening and on the dielectric layer. A planarization process is performed to remove a portion of the second silicide layer above the dielectric layer, wherein the remaining second silicide layer in the opening, the silicide electrode and the polysilicon electrode together form a bottom electrode of the capacitor. A capacitor dielectric layer is formed over the substrate. A first metal layer is formed over the substrate. The first metal layer is patterned to form an upper electrode of the capacitor.

20 Claims, 8 Drawing Sheets

METHOD FOR MANUALLY MANUFACTURING CAPACITOR

BACKGROUND OF THE INVENTION

1. Field of Invention

The present invention relates to a method for manufacturing a capacitor and an interconnect. More particularly, the present invention relates to a method for manufacturing a capacitor and an interconnect of a mixed-mode circuit.

2. Description of Related Art

A mixed-mode circuit device typically includes a circuit comprising both digital and analog devices in a logic area of a semiconductor chip. The digital devices include inverters, adders, and the analog devices include amplifiers and analog-to-digital converters. Currently, the mixed-mode circuit device comprises a capacitor structure. In the common mixed-mode logic manufacturing process, double polysilicon layers are used as capacitor electrodes. The capacitor with double polysilicon layers as electrodes are called a double polysilicon capacitor (DPC).

FIG. 1 is schematic, cross-sectional view of a conventional double polysilicon capacitor. Conventionally, the method for manufacturing a double polysilicon capacitor comprises the steps of forming a thin oxide layer (not shown) and a polysilicon layer (not shown) on a substrate 100 and an isolation region 116, and then patterning the thin oxide layer and the polysilicon layer to form a polysilicon gate electrode 106 and gate oxide layer 104 of a field effect transistor 110 and to form a bottom electrode 108 of a double polysilicon capacitor 102. The field effect transistor 110 is located on the substrate 100 and the bottom electrode 108 is located on the field oxide layer 116. After that, a dielectric layer (not shown) and a polysilicon layer (not shown) are formed on the substrate 100 and then the dielectric layer and the polysilicon layer are patterned to form a capacitor dielectric layer 112 and an upper electrode 114 of the double polysilicon capacitor 102.

The thickness of the polysilicon layer used to form the bottom electrode 108 is different from that of the polysilicon layer used to form the upper electrode 114, so that the polysilicon layer on the sidewall of the bottom electrode 108 is difficult to remove in the patterning process. The stringer effect easily occurs.

Additionally, in order to increase the conductivity of the bottom electrode 108 and the upper electrode 114, dopants are implanted into the bottom electrode 108 and the upper electrode 114. However, the resistance of the bottom electrode 108 and the upper electrode 114 is still high. Moreover, when the mixed-mode device is operated, the dopants in the capacitor are affected by the supplied voltage to form a depletion region at the interface between the capacitor dielectric layer 112 and the bottom electrode 108 and at the interface between the capacitor dielectric layer 112 and the upper electrode 114. The depletion region is considered an extension of the thickness of the capacitor dielectric layer 112. Nevertheless, the charge storage ability of the capacitor 102 is related to the thickness of the capacitor dielectric layer 112. The charge storage ability of the capacitor worsens as the thickness of the capacitor dielectric layer 112 increases. Therefore, the capacitance of the capacitor 102 is decreased and the operation efficiency of the devices is decreased. Furthermore, the thickness of the depletion region varies with the supplied voltage, that leads to an increase voltage coefficient (1/C, dC/dV) for the capacitor. Hence, the capacitance of the capacitor 102 varies with the supplied voltage and the devices are unstable.

In the analog circuit, the capacitance is used as a converting basis for the time delay ($\square$, $\square$=RC), so that the accuracy capacitance requirement of the analog devices is very critical. Incidentally, the operation efficiency is greatly affected by the increase of the voltage coefficient.

Additionally, the capacitor 102 is a two-dimensional capacitor. The surface of the capacitor 102 is increased to increase the capacitance. However, the increase of the capacitor surface leads to decreased device integration.

SUMMARY OF THE INVENTION

The invention provides a method for manufacturing a capacitor for a mixed-mode circuit. A substrate is provided. An isolation region is formed on the substrate to define an active region in the substrate. An oxide layer, a first polysilicon layer and a first silicide layer are formed over the substrate. The oxide layer, the first polysilicon layer and the first silicon layer are patterned to form a gate structure on the active region and to form a first polysilicon electrode and a first silicide electrode on the isolation region. A dielectric layer is formed over the substrate. An opening is formed to expose a portion of the first silicide electrode. A second silicide layer is formed on a sidewall and a bottom of the opening and on the dielectric layer. A planarization process is performed to remove a portion of the second silicide layer above the dielectric layer, wherein the remaining second silicide layer in the opening, the silicide electrode and the polysilicon electrode together form a bottom electrode of the capacitor. A capacitor dielectric layer is formed over the substrate. A first metal layer is formed over the substrate. The first metal layer is patterned to form an upper electrode of the capacitor.

The invention provides a method of manufacturing a capacitor for a mixed-mode circuit. A substrate is provided. A first metal layer is formed on the substrate. The first metal layer is patterned to form a first wire and a first bottom electrode. A dielectric layer is formed over the substrate. An opening is formed to expose a portion of the first bottom electrode. A second metal layer is formed on a sidewall and a bottom of the opening and on the dielectric layer. A planarization process is performed to remove a portion of the second metal layer above the dielectric layer, wherein the remaining second metal layer in the opening and the first bottom electrode together form a second bottom electrode of the capacitor. A capacitor dielectric layer is formed over the substrate. A third metal layer is formed over the substrate. The third metal layer is patterned to form a first upper electrode of the capacitor.

As embodied and broadly described herein, the invention provides a method for manufacturing a capacitor of a mixed-mode circuit. Because both of the upper electrode and the bottom electrode are made of metal, the resistance of the capacitor is low and the operation efficiency can be greatly improved. Moreover, the stability problem caused by the doped electrodes can be overcome. Furthermore, since the capacitor formed in the opening is a three-dimensional capacitor, the surface of the capacitor is increased and the integration of the devices is not decreased with the increasing of the surface of the capacitor. Incidentally, the stringer effect due to the difference between the polysilicon layers will not occur in the invention, so that the reliability of the devices is increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The First Embodiment

FIGS. 2A through 2G are schematic, cross-sectional views of the process for manufacturing a capacitor of a mixed-mode circuit in a first preferred embodiment according to the invention.

Figure 1:
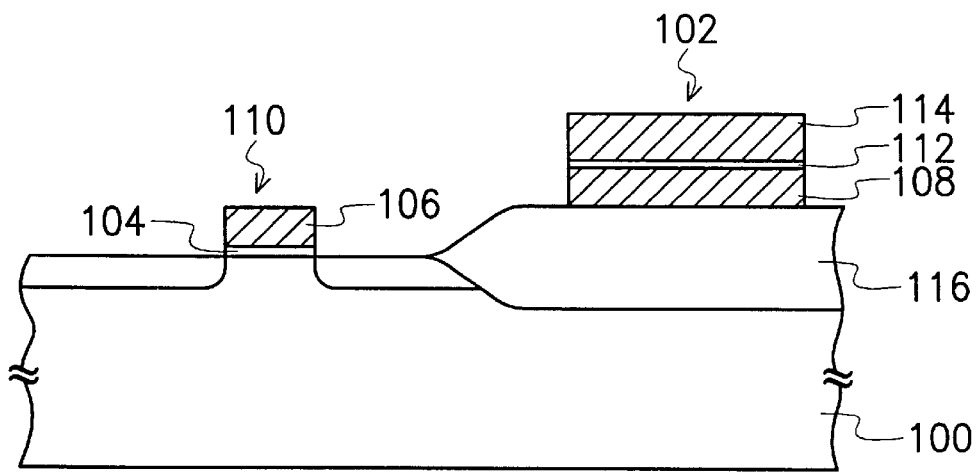
FIGS. 1 is schematic, cross-sectional view of a conventional double polysilicon capacitor.
Figure 2A:
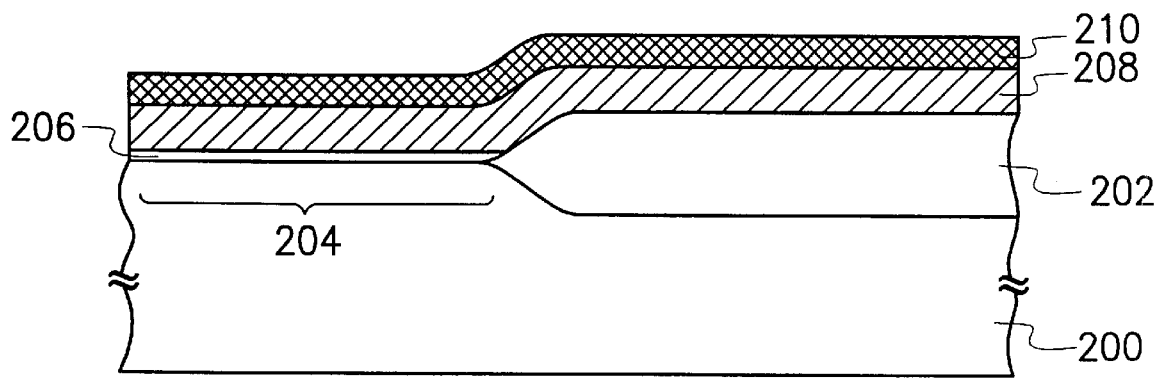
FIGS. 2A through 2G are schematic, cross-sectional views of the process for manufacturing a capacitor of a mixed-mode circuit in a first preferred embodiment according to the invention.

As shown in FIG. 2A, an isolation region 202 is formed on a substrate 200 to define an active region 204 in the substrate 200. The substrate 200 can be a P-type silicon substrate and the method of forming the isolation region 202 can be local oxidation, for example. A thin oxide layer 206 is formed on the active region 204 of the substrate 200. A polysilicon layer 208 and a silicide layer 210 are formed over the substrate 200. The method of forming the thin oxide layer can be thermal oxidation or chemical vapor deposition (CVD), for example. The method of forming the polysilicon layer 208 can be CVD, for example. Preferably, the method of forming the polysilicon layer 208 is low-pressure chemical vapor deposition (LPCVD). The silicide layer 210 can be formed from tungsten silicon by CVD or sputtering, for example.

Figure 2B:
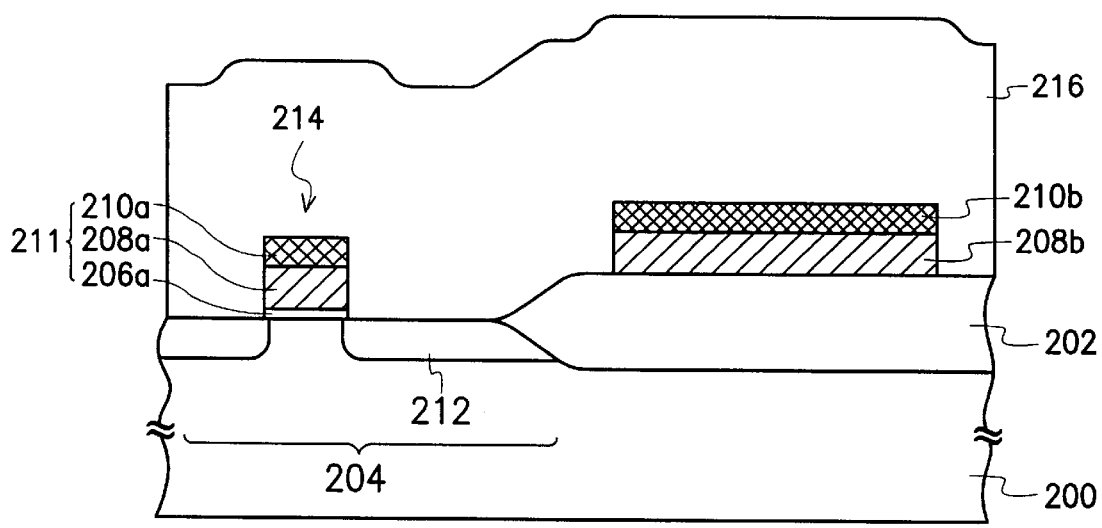

As shown in FIG. 2B, the silicide layer 210, the polysilicon layer 208 and the thin oxide layer 206 are patterned to form silicide layers 210a and 210b, polysilicon layers 208a and 208b, and a thin oxide layer 206a. The silicide layer 210a, the polysilicon layer 208a and the thin oxide layer 206a together form a gate structure 211 on the active region 204 of the substrate 200. The silicide layer 210b and the polysilicon layer 208b are used as a bottom electrode of a capacitor. A source/drain region 212 is formed in the substrate 200 exposed by the gate structure 211. The method of forming the source/drain region 212 can be implantation with dopants such as arsenic ions or phosphorus ions, for example. An inter-dielectric layer (ILD) 216 is formed over the substrate 200. The ILD layer 216 can be formed from silicon oxide by CVD, for example.

Figure 2C:
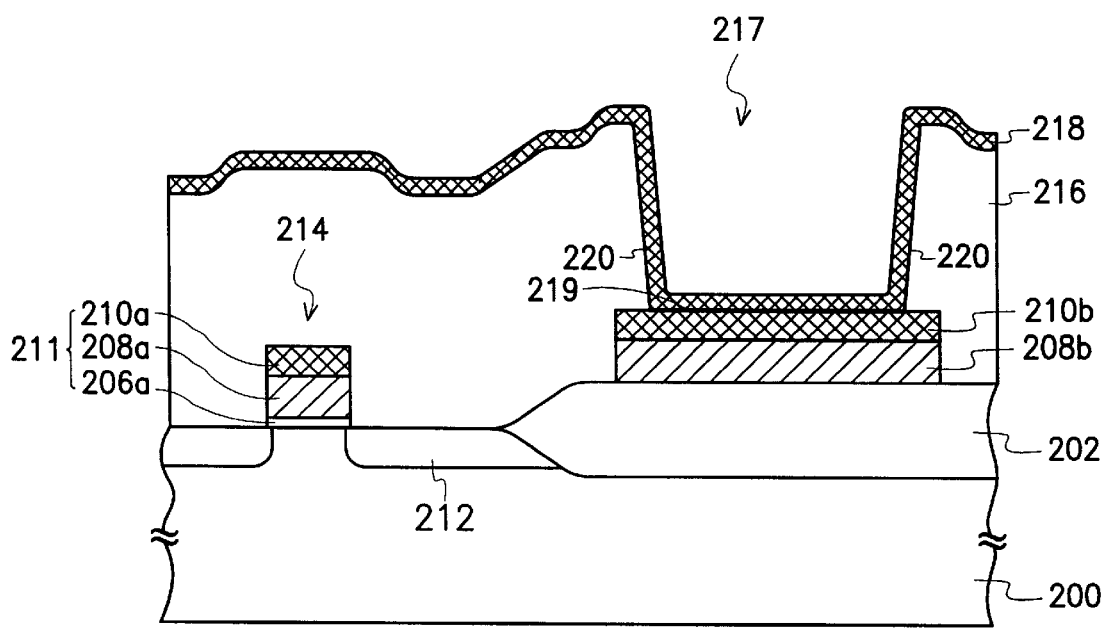

As shown in FIG. 2C, the ILD layer 216 is patterned to form an opening 217 exposing a portion of the silicide layer 210b. A silicide layer 218 is formed on the ILD layer 216, a sidewall 220 of the opening 217 and the bottom 219 of the opening 217. The silicide layer 218 can be formed from tungsten silicon by CVD or sputtering, for example.

Figure 2D:
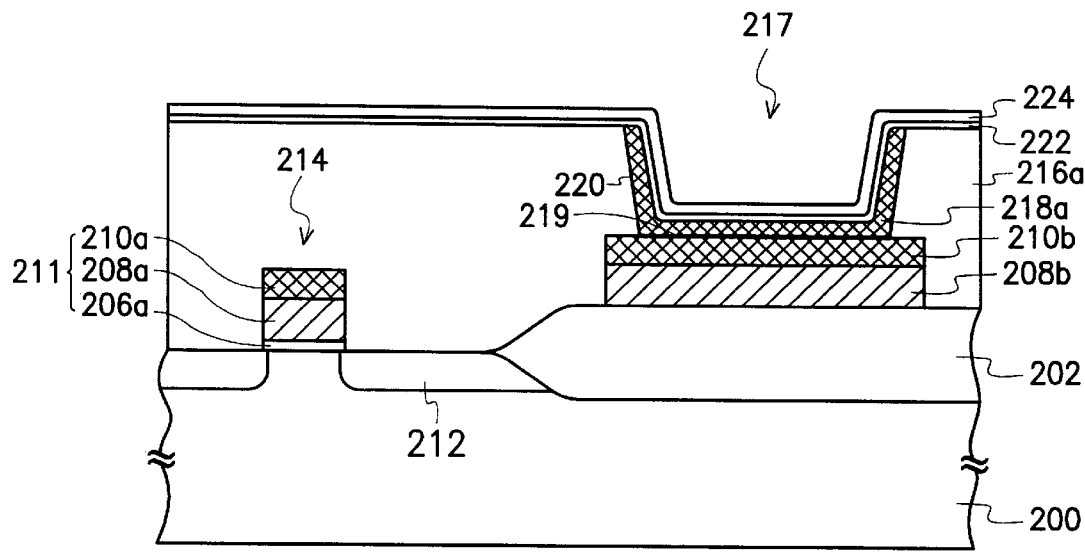

As shown in FIG. 2D, a planarization process is performed to remove a portion of the silicide layer 218 above the ILD layer 216 and to form a dielectric layer 216a with an even surface. The remaining silicide layer 218a on the sidewall 220 of the opening 217 and the bottom 219 of the opening 217 is used as a part of the bottom electrode of the capacitor. The planarization process can be chemical-mechanical polishing (CMP), for example. A capacitor dielectric layer 222 is formed on the dielectric layer 216a and the silicide layer 218a. The capacitor dielectric layer 222 can be formed from high temperature oxide (HTO) by CVD, for example.

Figure 2E:
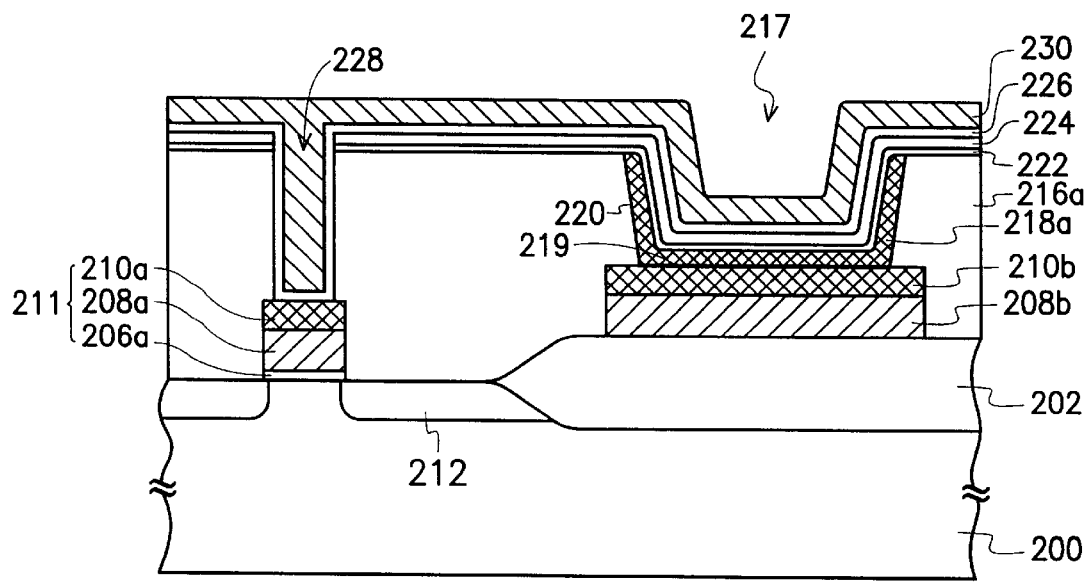

As shown in FIG. 2E, a contact hole 228 is formed in the dielectric layer 216a. In this embodiment, the contact hole 228 is denoted as a contact hole exposing a portion of the silicide layer 210a. In order to protect the capacitor dielectric layer 222 from the etching damage that might occur during the formation of the contact hole 228, preferably, a metal layer 224 is formed on the capacitor dielectric layer 222 before the contact hole 228 is formed (as shown in FIG. 2D). The metal layer 224 can be formed from titanium/titanium nitride by CVD or sputtering, for example. A conformal metal layer 226 is formed over the substrate. The conformal metal layer 226 can be formed from titanium/titanium nitride by CVD or sputtering, for example. A portion of the conformal metal layer 226 formed in the contact hole 228 is used as a adhesion layer and a barrier layer to increase the adhesion ability between the dielectric layer 216a and the subsequently formed metal layer 230 or to protect dielectric layer 216a from the diffusion of the metal atoms from the subsequently formed metal layer 230. The metal layers 226 and 224 together form an upper electrode of the capacitor. A metal layer 230 is formed over the substrate 200 and fills the contact hole 228. The metal layer 230 can be formed from aluminum, aluminum lightly alloyed with silicon and copper, copper or tungsten by CVD or sputtering, for example.

Figure 2F:
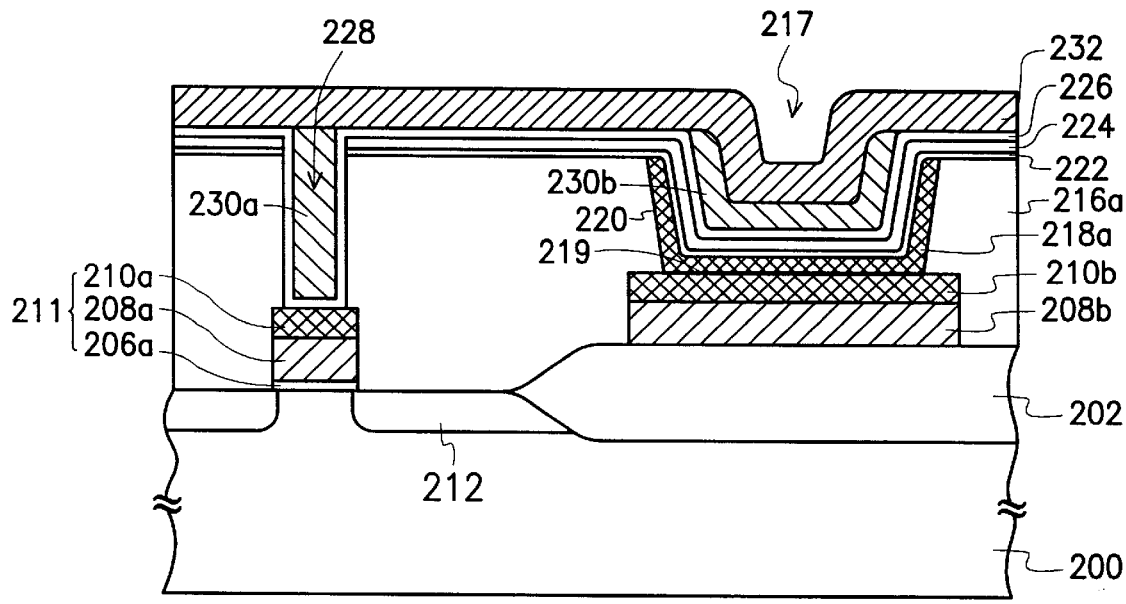

As shown in FIG. 2F, a portion of the metal layer 230 above the dielectric layer 216a is removed to expose the surface of the metal layer 226. The remaining metal layer 230a in the contact hole 228 is used as a contact plug. The remaining metal layer 230b in the opening 217 can be used as a part of the upper electrode of the capacitor. The method of removing the portion of the metal layer 230 can be etching back or CMP, for example. A metal layer 232 is formed over the substrate 200. The metal layer 232 can be formed from aluminum, aluminum lightly alloyed with silicon and copper or copper by CVD or sputtering, for example.

Figure 2G:
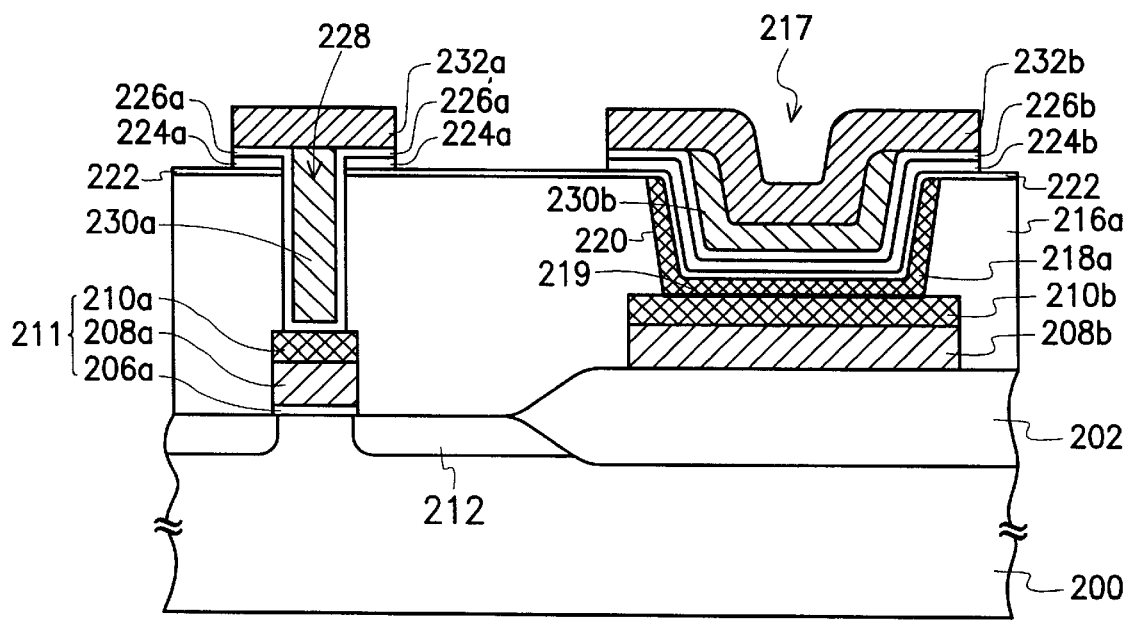

As shown in FIG. 2G, the metal layers 232, 226 and 224 are patterned to form metal layers 232a, 226a and 224a over the active region 204 and to form metal layers 232b, 226b and 224b over the isolation region 202. The metal layer 232a is used as a wire electrically coupled to the contact plug 230a. The metal layers 226b and 224b together form the upper electrode of the capacitor.

In the first embodiment, the silicide layer 218a is used as the bottom electrode and the metal layers 226b and 224b are used as the upper electrode, so that both the upper electrode and the bottom electrode are made of metal. Therefore, the resistance of the capacitor is low and the operation efficiency can be greatly improved. Moreover, the stability problem caused by the doped electrodes can be overcome.

Incidentally, the capacitor formed in the opening 217 is a three-dimensional capacitor, so that the surface of the capacitor is increased and the integration of the devices is not decreased with the increasing of the surface of the capacitor. Furthermore, the stringer effect due to the difference between the polysilicon layers will not occur in the invention, so that the reliability of the devices is increased.

The Second Embodiment

FIGS. 3A through 3G are schematic, cross-sectional views of the process for manufacturing a capacitor for a mixed-mode circuit in a second preferred embodiment according to the invention.

Figure 3A:
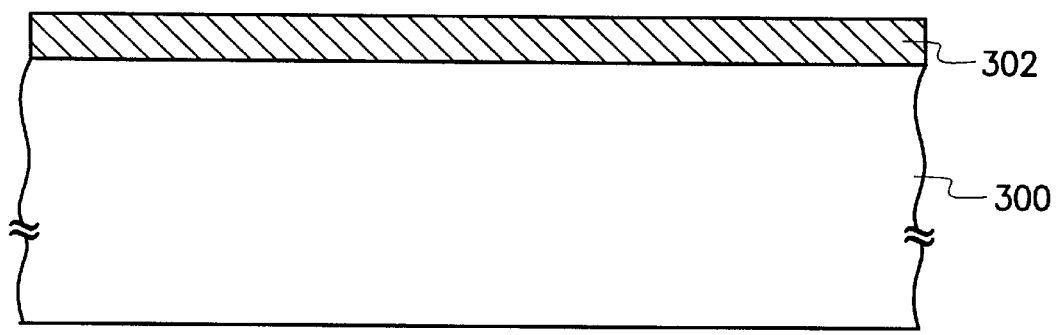
FIGS. 3A through 3G are schematic, cross-sectional views of the process for manufacturing a capacitor of a mixed-mode circuit in a second preferred embodiment according to the invention.

As shown in FIG. 3A, a metal layer 302 is formed on a substrate 302. The substrate 300 can be a semiconductor substrate or a substrate having semiconductor devices which are formed in the substrate by the front end process, for example. The metal layer 302 can be formed from titanium/titanium nitride, aluminum, aluminum lightly alloyed with silicon and copper or copper by CVD or sputtering, for example.

Figure 3B:
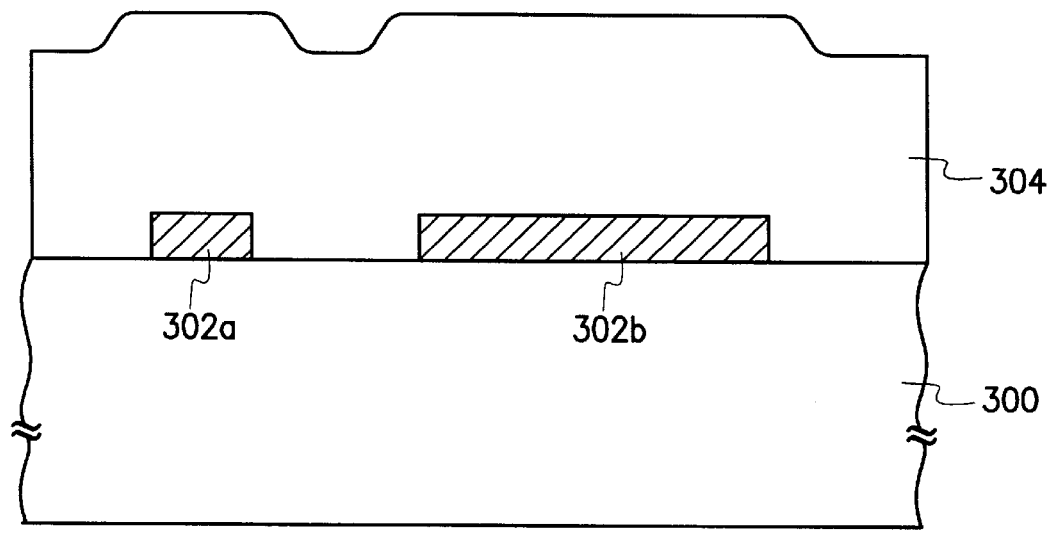

As shown in FIG. 3B, the metal layer 302 is patterned to form metal layers 302a and 302b. The metal layer 302a is used as a metal wire and the metal layer 302b is used as a part of a bottom electrode of a capacitor. An inter-metal dielectric layer 304 is formed on the metal layers 302a and 302b and the substrate 300. The material of the inter-metal dielectric layer 304 can be silicon oxide, for example. In this example, the method of forming the inter-metal dielectric layer 304 comprises forming an oxide layer over the substrate 300 by plasma enhanced chemical vapor deposition (PECVD), forming a spin-on-glass (SOG) layer on the oxide layer to planarize the oxide layer, and forming another oxide layer on the SOG layer by CVD.

Figure 3C:
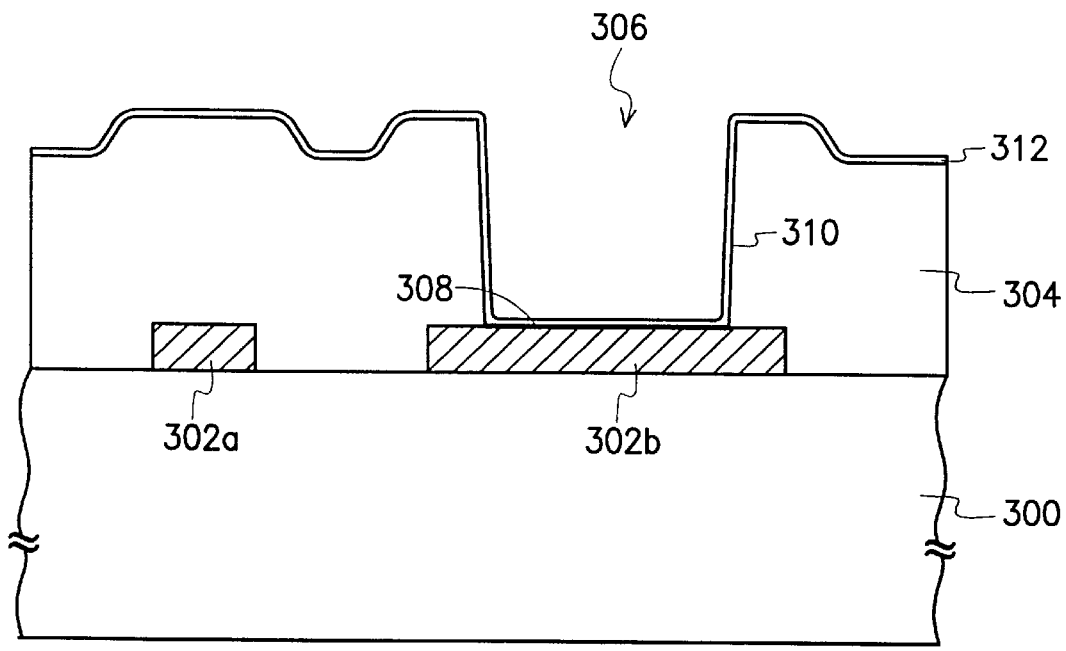

As shown in FIG. 3C, an opening 306 is formed in the inter-metal dielectric layer 304 and exposes a portion of the metal layer 302b. A metal layer 312 is formed on the inter-metal dielectric layer 304, on the sidewall 310 of the opening 306 and on the bottom 308 of the opening 306. The metal layer 312 can be formed from titanium or titanium/titanium nitride by CVD or sputtering, for example.

Figure 3D:
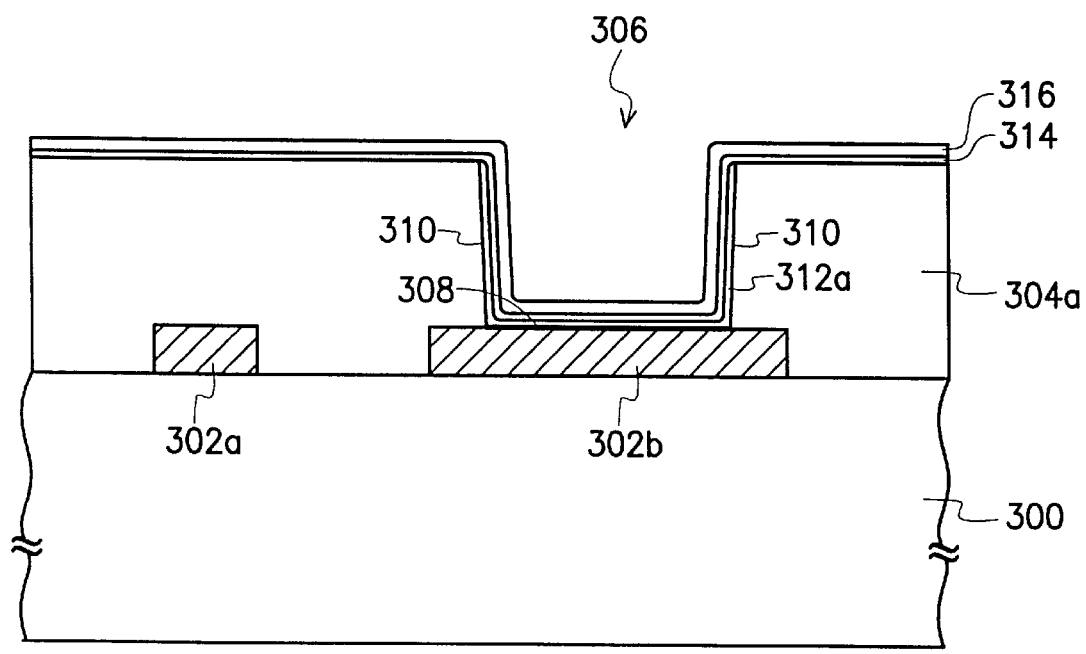

As shown in FIG. 3D, a planarization process is performed to remove a portion of the metal layer 312 above the inter-metal dielectric layer 304 and to form a dielectric layer 304a with an even surface. The remaining metal layer 312a on the sidewall 310 of the opening 306 and the bottom 308 of the opening 306 is used as a part of the bottom electrode of the capacitor. The planarization process can be CMP, for example. A capacitor dielectric layer 314 is formed on the dielectric layer 304a and the metal layer 312a. The capacitor dielectric layer 314 can be formed from HTO by CVD, for example.

Figure 3E:
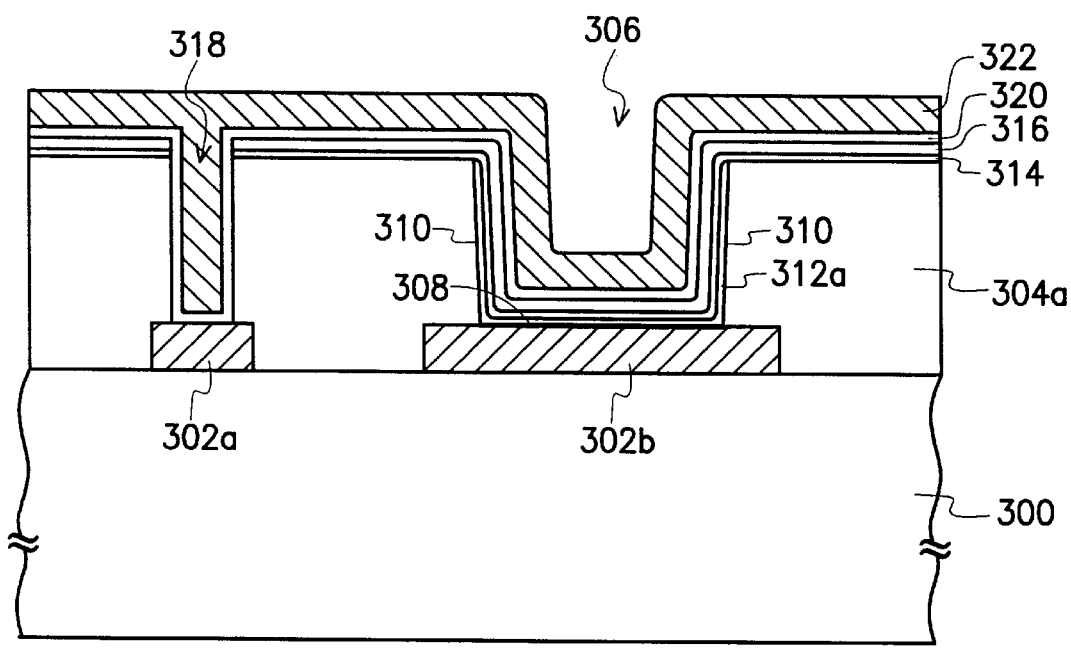

As shown in FIG. 3E, a via hole 318 is formed in the dielectric layer 304a. In this embodiment, the via hole 318 is denoted as a contact hole exposing a portion of the metal layer 302a. In order to protect the capacitor dielectric layer 314 from the etching damage that might occur during the formation of the via hole 318, preferably, a metal layer 316 formed on the capacitor dielectric layer 314 before the via hole 318 is formed (as shown in FIG. 3D). The metal layer 316 can be formed from titanium/titanium nitride by CVD or sputtering, for example. A conformal metal layer 320 is formed over the substrate. The conformal metal layer 320 can be formed from titanium/titanium nitride by CVD or sputtering, for example. A portion of the conformal metal layer 320 formed in the via hole 318 is used as a adhesion layer and a barrier layer to increase the adhesion ability between the dielectric layer 304a and the subsequently formed metal layer 322 or to protect dielectric layer 304a from the diffusion of the metal atoms from the subsequently formed metal layer 322. The metal layers 320 and 316 together form an upper electrode of the capacitor. A metal layer 322 is formed over the substrate 300 and fills the via hole 318. The metal layer 322 can be formed from titanium/titanium nitride, aluminum, aluminum lightly alloyed with silicon and copper, copper or tungsten by CVD or sputtering, for example.

Figure 3F:
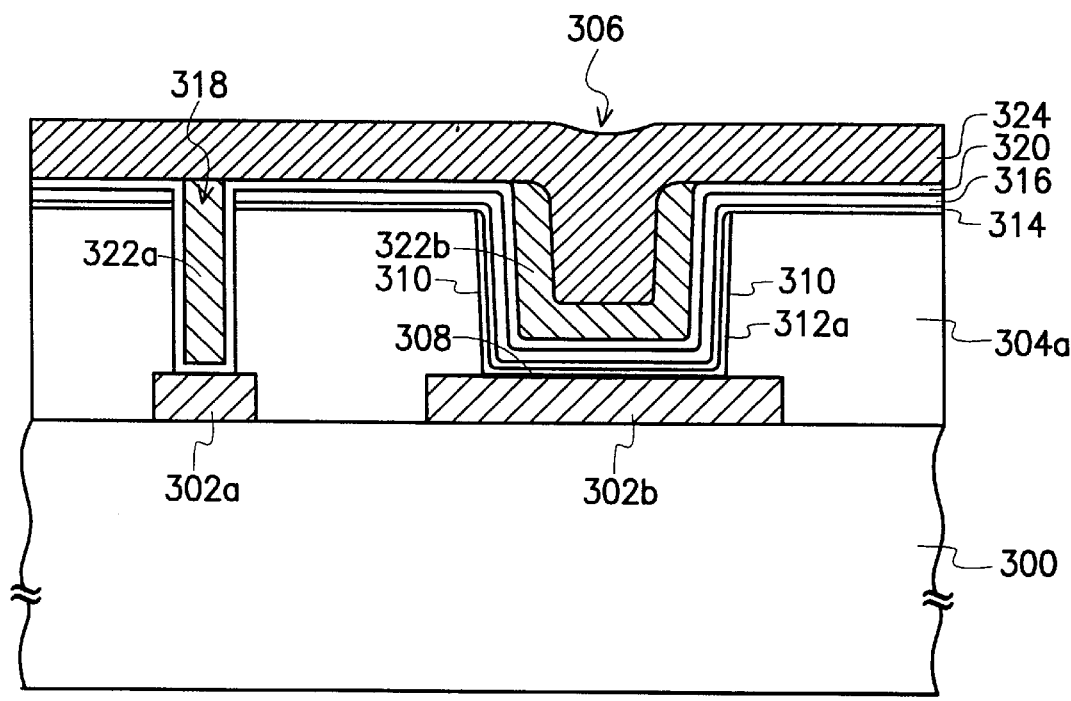

As shown in FIG. 3F, a portion of the metal layer 322 above the dielectric layer 304a is removed to expose the surface of the metal layer 316. The remaining metal layer 322a in the via hole 318 is used as a metal plug. The remaining metal layer 322b in the opening 306 can be used as a part of the upper electrode of the capacitor. The portion of the metal layer 322 can be removed by etching back or CMP, for example. A metal layer 324 is formed over the substrate 300. The metal layer 324 can be formed from titanium/titanium nitride, aluminum, aluminum lightly alloyed with silicon and copper or copper by CVD or sputtering, for example.

Figure 3G:
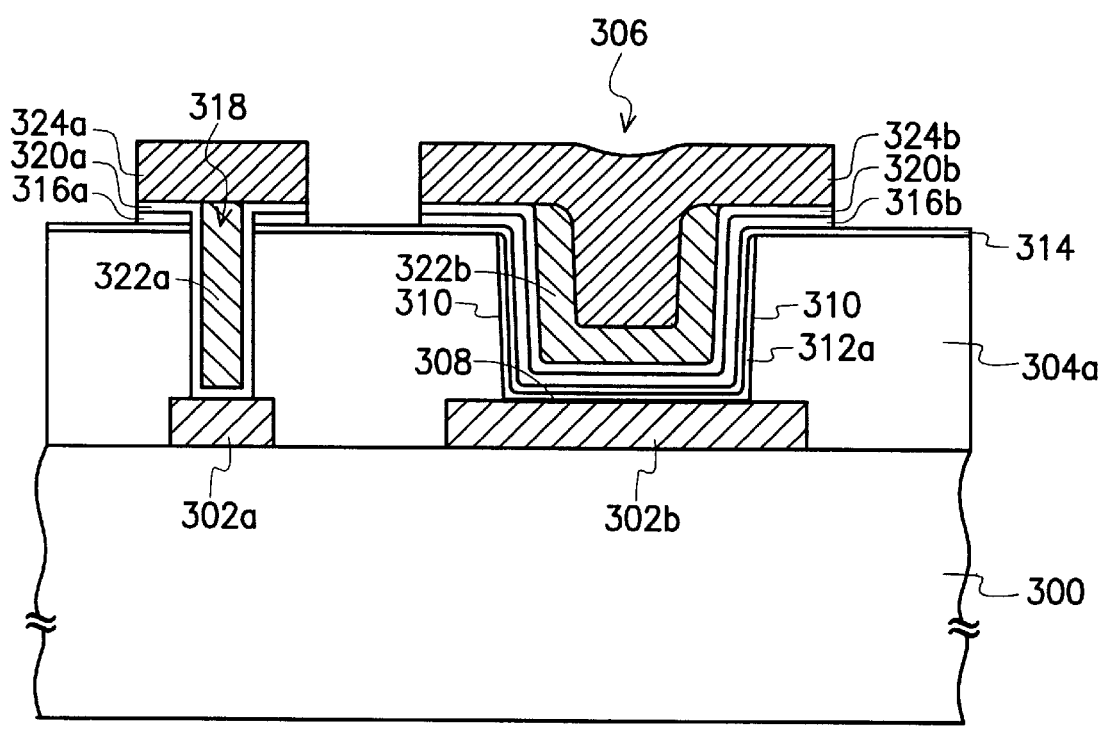

As shown in FIG. 3G, the metal layers 324, 320 and 316 are patterned to form metal layers 324a, 320a and 316a over the metal layer 302a and to form metal layers 324b, 320b and 316b over the metal layer 302b. The metal layer 324a is used as a wire electrically coupled to the metal plug 322a. The metal layers 316b and 320b together form the upper electrode of the capacitor.

In the second embodiment, both of the upper electrode and the bottom electrode are made of metal, so that the resistance of the capacitor is low and the operation efficiency can be greatly improved. Moreover, the stability problem caused by the doped electrodes can be overcome.

Additionally, since the capacitor formed in the opening 306 is a three-dimensional capacitor, the surface of the capacitor is increased and the integration of the devices is not decreased with the increasing of the surface of the capacitor. Furthermore, the stringer effect due to the difference between the polysilicon layers will not occur in the invention, so that the reliability of the devices is increased.

Altogether, the invention provides the following advantages:

1. By using the invention, the resistance of the capacitor can be greatly decreased.
2. By using the invention, the operation efficiency is greatly improved.
3. By using the invention, the charge storage ability of the capacitor can be increased.
4. By using the invention, the problem caused by the stringer effect can be overcome.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a capacitor for a mixed-mode circuit, comprising the steps of:

providing a substrate;

forming an isolation region on the substrate to define an active region in the substrate;

forming an oxide layer, a first polysilicon layer and a first silicide layer over the substrate;

patterning the oxide layer, the first polysilicon layer and the first silicide layer to form a gate structure on the active region and to form a first polysilicon electrode and a first silicide electrode on the isolation region;

forming a dielectric layer over the substrate;

forming an opening exposing a portion of the first silicide electrode;

forming a second silicide layer on a sidewall and a bottom of the opening and on the dielectric layer;

performing a planarization process to remove a portion of the second silicide layer above the dielectric layer, wherein the remaining second silicide layer in the opening, the silicide electrode and the polysilicon electrode together form a bottom electrode of the capacitor;

forming a capacitor dielectric layer over the substrate;

forming a first metal layer over the substrate; and patterning the first metal layer to form an upper electrode of the capacitor.

2. The method of claim 1, wherein before the step of forming the first metal layer, further comprises forming a contact hole and forming a second metal layer to cover the opening and the contact hole.

3. The method of claim 2, wherein after the step of forming the second metal layer, further comprises steps of:

forming a third metal layer over the substrate; and removing a portion of the third metal layer above the dielectric layer to form a contact plug in the contact hole.

4. The method of claim 3, wherein after the step of forming the third metal layer, further comprises steps of:

forming a fourth metal layer over the substrate; and patterning the fourth metal layer, the second metal layer and the first metal layer to form a wire electrically coupled to the contact plug and to form a part of the upper electrode of the capacitor.

5. The method of claim 3, wherein the step of removing the portion of the third metal layer includes chemical-mechanical polishing.

6. The method of claim 3, wherein the step of removing the portion of the third metal layer includes etching back.

7. The method of claim 3, wherein the first metal layer and the second metal layer can be titanium/titanium nitride layers and the third metal layer can be a tungsten layer.

8. The method of claim 3, wherein the planarization process includes chemical-mechanical polishing.

9. The method of claim 1, wherein the planarization process includes chemical-mechanical polishing.

10. The method of claim 1, wherein the first metal layer can be a titanium/titanium nitride layer.

11. A method of manufacturing a capacitor for a mixed-mode circuit, comprising the steps of:

providing a substrate;

forming a first metal layer on the substrate;

patterning the first metal layer to form a first wire and a first bottom electrode;

forming a dielectric layer over the substrate;

forming an opening exposing a portion of the first bottom electrode;

forming a second metal layer on a sidewall and a bottom of the opening and on the dielectric layer;

performing a planarization process to remove a portion of the second metal layer above the dielectric layer, wherein the remaining second metal layer in the opening and the first bottom electrode together form a second bottom electrode of the capacitor;

forming a capacitor dielectric layer over the substrate;

forming a third metal layer over the substrate; and patterning the third metal layer to form a first upper electrode of the capacitor.

12. The method of claim 11, wherein before the step of forming the third metal layer, further comprises forming a via hole and forming a fourth metal layer to cover the opening and the via hole.

13. The method of claim 12, further comprising after the step of forming the fourth metal layer, the steps of:

forming a fifth metal layer over the substrate; and removing a portion of the fifth metal layer above the dielectric layer to form a via plug in the via hole.

14. The method of claim 13, wherein after the step of forming the fifth metal layer, further comprises steps of:

forming a sixth metal layer over the substrate; and patterning the sixth metal layer, the third metal layer and the fourth metal layer to form a second wire electrically coupled to the via plug and to form a second upper electrode of the capacitor.

15. The method of claim 13, wherein the planarization process includes chemical-mechanical polishing.

16. The method of claim 13, wherein the step of removing the portion of the fifth metal layer includes chemical-mechanical polishing.

17. The method of claim 13, wherein the step of removing the portion of the fifth metal layer includes etching back.

18. The method of claim 13, wherein the first metal layer, the second metal layer, the third metal layer and the fourth metal layer can be titanium/titanium nitride layers and the fifth metal layer can be a tungsten layer.

19. The method of claim 11, wherein the planarization process includes chemical-mechanical polishing.

20. The method of claim 11, wherein the first metal layer, the second metal layer and the third metal layer can be titanium/titanium nitride layers.

* * * * *